United States Patent [19]

Chung

[11] Patent Number: 5,422,849

[45] Date of Patent: Jun. 6, 1995

[54] SERIAL DATA INPUT DEVICE FOR USE IN A DUAL PORT MEMORY DEVICE

[75] Inventor: Hyung-Sub Chung, Kyungki-do, Rep. of Korea

[73] Assignee: Samsung Electronics Co., Ltd., Kyungki-do, Rep. of Korea

[21] Appl. No.: 224,496

[22] Filed: Apr. 7, 1994

[30] Foreign Application Priority Data

Oct. 4, 1993 [KR] Rep. of Korea ............. 6020/1993

[51] Int. Cl.⁶ .................................................. G11C 7/00
[52] U.S. Cl. ............................ 365/189.05; 365/189.12; 365/221; 365/240
[58] Field of Search ................. 365/189.05, 189.03, 365/189.04, 219, 221, 189.12, 239, 240

[56] References Cited

U.S. PATENT DOCUMENTS

| | | | |
|---|---|---|---|
| 4,799,198 | 1/1989 | Ogawa | 365/221 |
| 4,912,680 | 3/1990 | Masaki et al. | 365/189.04 |
| 4,987,559 | 1/1991 | Miyauchi et al. | 365/189.12 |
| 5,195,055 | 3/1993 | Mizuoka et al. | 365/189.05 |
| 5,343,439 | 8/1994 | Hoshino | 365/221 |

Primary Examiner—Joseph A. Popek
Assistant Examiner—Tan Nguyen
Attorney, Agent, or Firm—Stephen R. Whitt; Charles R. Donohoe

[57] ABSTRACT

A serial data port in a dual port memory device adapted to receive incoming serial data and transfer the incoming serial data to a general data register, comprising; a plurality of data latches storing a portion of the incoming serial data, each data latch comprising a plurality of shift registers, and each shift register being responsive to one of a plurality of sequentially generated shift register control signals, and a plurality of transfer gates, each transfer gate gating the incoming serial data into a corresponding data latch in responsive to a one of a plurality of sequentially generated data latch control signals, wherein each data latch control signal defines a time period, and the plurality of shift register control signals is sequentially generated within the time period.

5 Claims, 3 Drawing Sheets

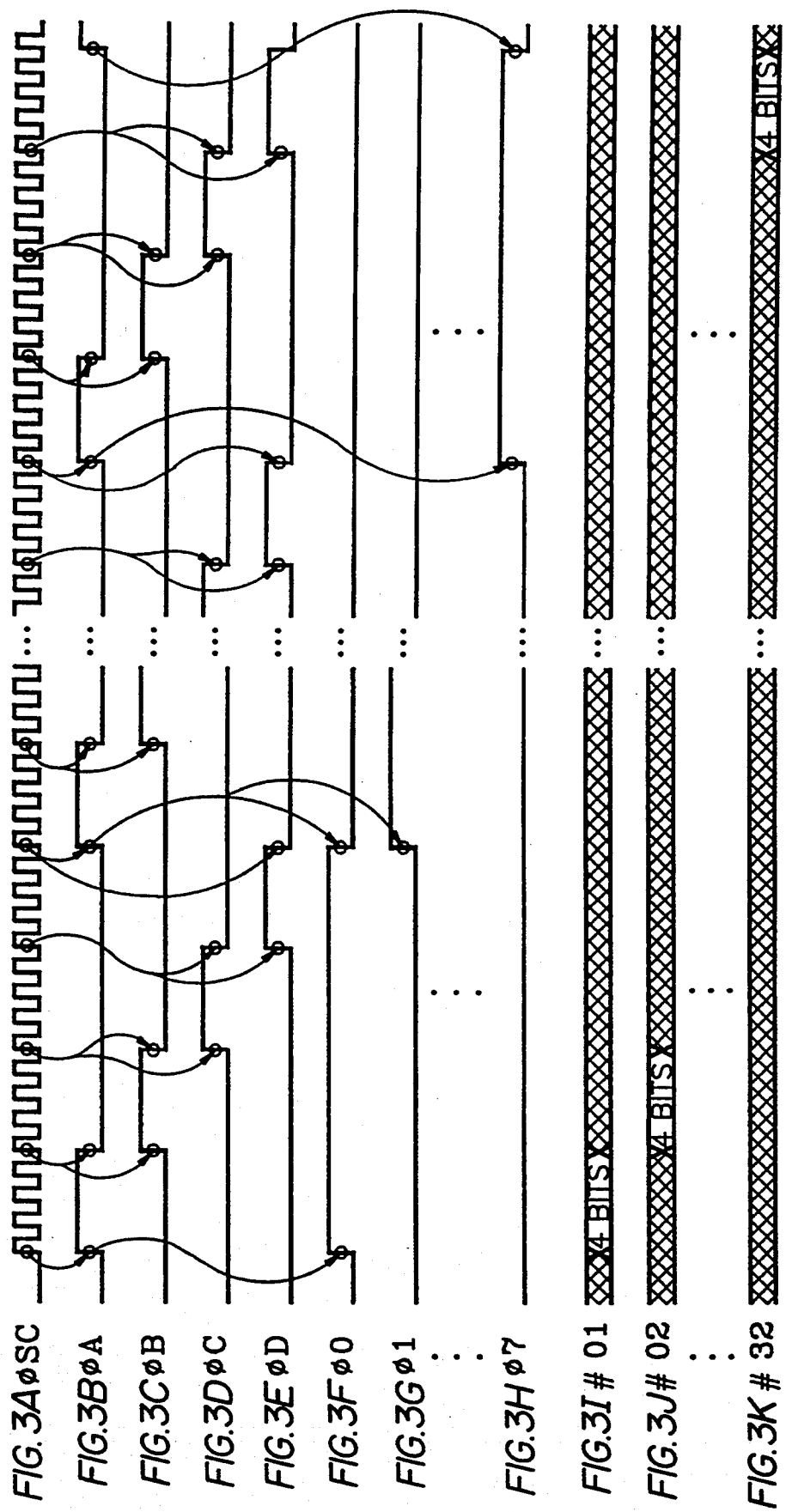

SERIAL DATA INPUT DEVICE FOR USE IN A DUAL PORT MEMORY DEVICE

BACKGROUND OF THE INVENTION

The present invention relates to a dual port memory device, and more particularly to a serial data input device for use in a dual port memory device.

Contemporary image display devices operate at increasingly higher speeds and with greater image resolution. Thus, memory devices used to store image data must operate at high speeds. It is also desirable for such memory devices to be highly integrated. Conventional dual port memory devices have been used to store image data for image display devices. When so configured, a conventional dual port memory device typically includes a random port adapted to randomly access data, and a serial port adapted to serially access data.

FIG. 1 shows an input/output (I/O) section for a serial port in a conventional dual port memory device. As shown in FIG. 1 the serial port I/O section includes a memory cell array 10 which is typically a RAM, a data register 12 used to interchange data with memory cell array 10, a selector 14 which selects between operating modes for data register 12, a serial counter 16 which controls selector 14 in accordance with an external control signal, a serial write driver 20 which supplies a serial data input to data register 12, a serial I/O and sense amplifier 18 for transferring data from data register 12 to an external memory device, an I/O buffer 22 for receiving/transferring and converting incoming and outgoing data, and a date transfer controller 24 for controlling data transfer operations between memory cell array 10 and data register 12.

In operation, the I/O section of the conventional dual port memory device receives incoming data via an input pad from an external memory device at I/O buffer 22. I/O buffer 22 converts the incoming data signals to CMOS compatible signal levels, and transfers the data to data register 12 via serial write driver 20. Thus, a serial write operation generally consists of two steps. First, data is received (or input) at I/O buffer 22, or an analogous component. Second, the received data is transferred from I/O buffer 22 to data register 12 in order to be stored in memory cell array 10. The time delay between these first and second steps necessarily limits the speed at which serial write operations can be performed in conventional dual port memory devices. In fact, serial write operations through a single input port in conventional dual port memory devices are generally too slow to service contemporary image display devices.

In order to overcome this shortcoming, conventional dual port memory devices have resorted to the use of multiple serial data input ports. Until now, the use of multiple serial input ports was the only way to dump serial data to such memory devices at high speed. Unfortunately, limitations on available integrated circuit pin outs (or pads) make the allocation of multiple ports to serial data operations impracticable, if not impossible.

SUMMARY OF THE INVENTION

The present invention provides solves the foregoing problems and addresses other shortcomings within the prior art by providing a dual port memory device having a serial port which is capable of high speed write operations. In one aspect, the present invention provides a serial data port in a dual port memory device adapted to receive incoming serial data and transfer the incoming serial data to a general data register, comprising; a plurality of data latches storing a portion of the incoming serial data, each data latch comprising a plurality of shift registers, and each shift register being responsive to one of a plurality of sequentially generated shift register control signals, and a plurality of transfer gates, each transfer gate gating the incoming serial data into a corresponding data latch in responsive to a one of a plurality of sequentially generated data latch control signals, wherein each data latch control signal defines a time period, and the plurality of shift register control signals is sequentially generated within the time period.

BRIEF DESCRIPTION OF THE DRAWINGS

The above described benefits and other advantages of the present invention will become more apparent upon consideration of the preferred embodiment of the present invention with reference to the attached drawings. In the drawings, like elements are similarly designated with like reference numerals, wherein:

FIG. 3 is a timing diagram which illustrates the operation of the device shown in FIG. 2 during a serial write operation.

DETAILED DESCRIPTION OF THE INVENTION

Figure 2:
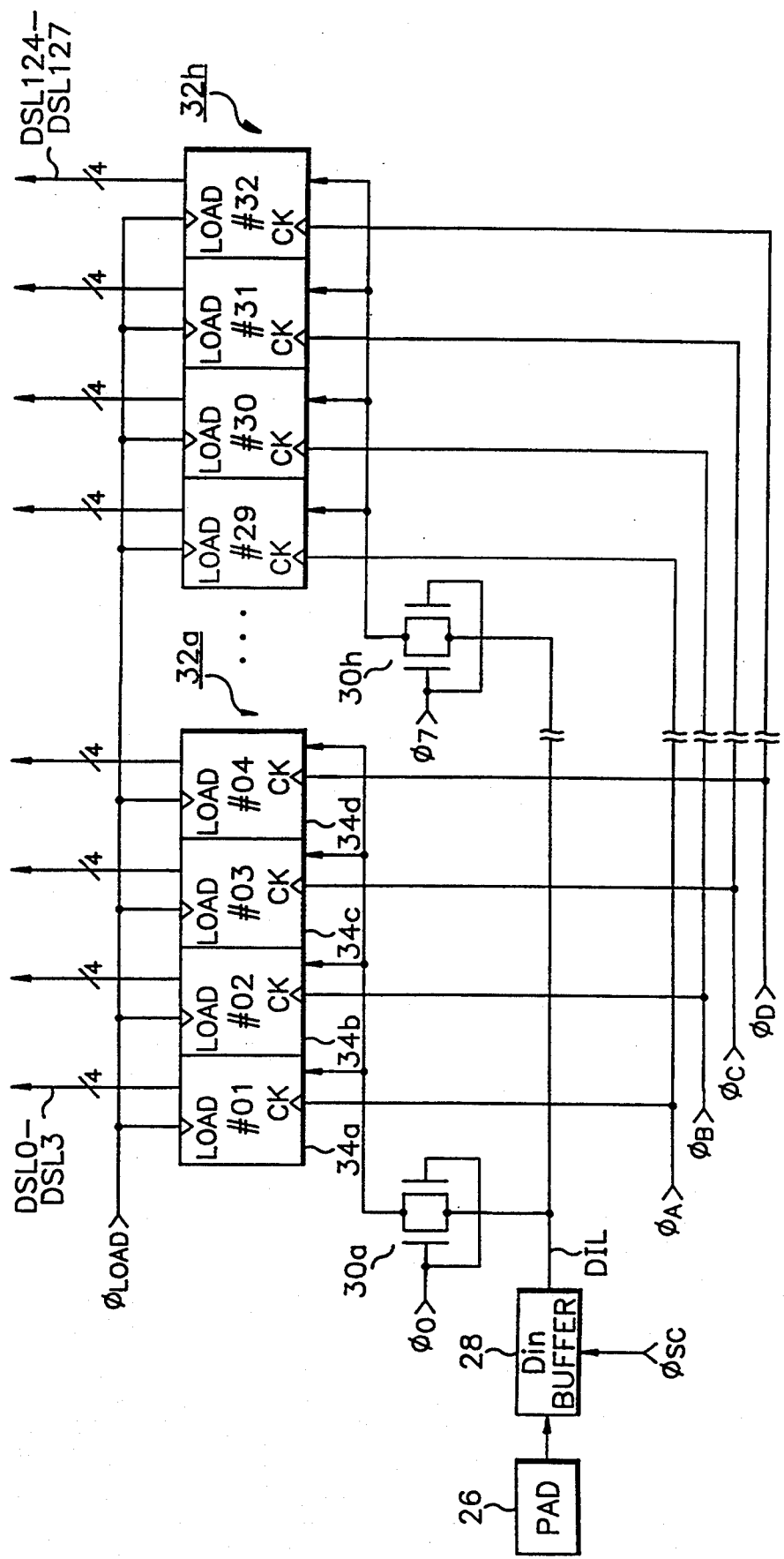
FIG. 2 is a circuit diagram illustrating an I/O section of a serial data port within a dual port memory device according to the present invention.

A preferred embodiment of a data I/O section for a serial port within a dual port memory device constructed according to the present invention is shown in FIG. 2. Referring to FIG. 2, external data from an external data source is applied to a data input buffer 28 via an input pad 26. In addition to receiving the incoming data, input buffer 28 preferably converts the incoming data signals to CMOS compatible voltage levels. In response to a control signal $\phi SC$, the incoming data transferred through input buffer 28 and placed on a data line DIL. Control signal $\phi SC$ which is synchronous with a serial clock signal SC functions as a master clock and controls serial write operations.

Data on data line DIL is transferred to a plurality of data latches 32a–32h via a corresponding plurality of NMOS transfer gates 30a–30h. Naturally, the presently preferred NMOS transfer gates can be replaced by analogous PMOS or CMOS structures. Data is respectively gated through respective NMOS transfer gates 30a–30h in accordance with transfer gate control signals $\phi 0$–$\phi 7$. That is, when $\phi 1$ goes high, NMOS transfer gate 30a is turned ON, when $\phi 2$ goes high, NMOS transfer gate 30b is turned ON, etc. Conversely, each NMOS transfer gate is turned OFF when its respective transfer gate control signal goes low.

Each individual data latch 32a–32h comprises a plurality of four (4), 4-bit shift registers (34a–34d for the illustrated example of data latch 32a). The 4-bit shift registers receive data through a corresponding one of the NMOS transfer gates 30a–30h in accordance with shift register control signals $\phi A$, $\phi B$, $\phi C$, and $\phi D$.

Thus, in operation, transfer gate control signals $\phi 0$–$\phi 7$ are sequentially generated (i.e., held high) to sequentially select individual data latches 32'a-32h. Within each individual data latch activation period, the shift register control signals φA-φD are sequentially generated to select individual shift register within the selected data latch.

Figure 1:
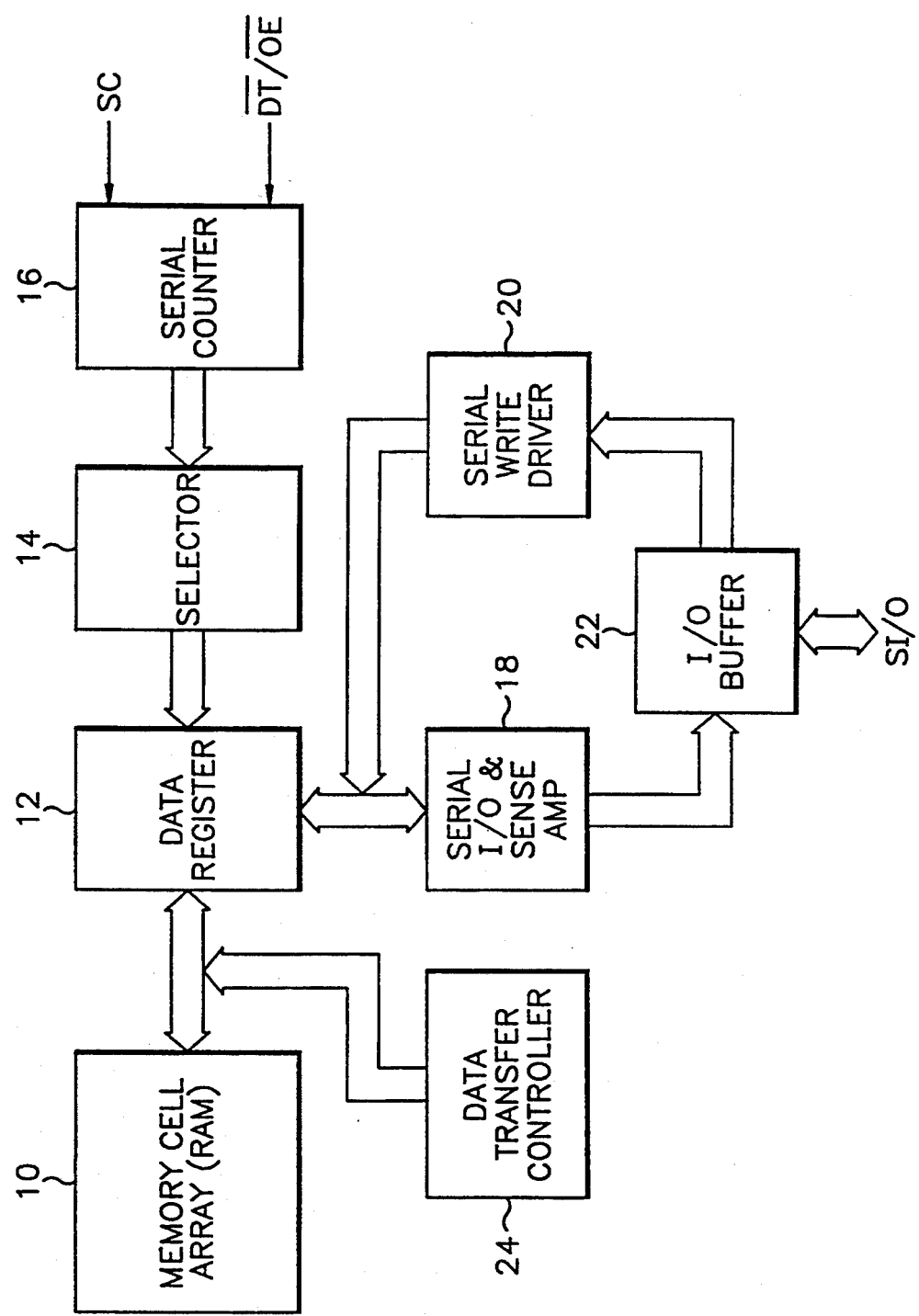
FIG. 1 is a functional block diagram of the data I/O section of a serial data port within a conventional dual port memory device.

Each 4-bit shift register receives one of the shift register control signals φA-φD at a clock terminal CK, and receives data a corresponding NMOS transfer gate at an input terminal. Data is output from individual shift registers to a general data register, such as data register 12 shown in FIG. 1, via a data bus having data lines (DSL) grouped, for example, in 4-bit sections (i.e., DSL0-DSL3 corresponding to data bits in shift register 34a of data latch 32a, DSL4-DSL7 corresponding to data bits in shift register 34b of data latch 32a . . . DSL124-DSL corresponding to data bits in shift register 34d of data latch 32h). Each shift register outputs four (4) parallel data bits when data loading control signal φLOAD goes high. Thus, in the presently preferred embodiment, 128 data bits may be serially input at high speed through a single serial data port, and yet be simultaneously transferred to a general data register.

Referring now to FIG. 3, the operation of the above described I/O section for a serial port in a dual port memory device will be further explained. Control signal φSC serves as the master clock for the serial write operation. Transfer gate control signals φ1-φ7 are sequentially generated to essentially partition the incoming serial data, and sequentially transfer each data partition into a respective data latch 32a-32h. Within each transfer gate control signal period, shift register control signals φA, φB, φC, and φD are sequentially generated to further partition the data, and sequentially transfer the further partitioned data into each shift register within the selected data latch.

As shown in FIG. 3, each shift register control signal, φA-φD, has a period four times that of φSC. Similarly, each data latch control signal φ1-φ7 has a period four times that of each register control signal, that is, a period equal to the sum of shift register control signals φA-φD. These signals are generated using conventional frequency dividing counters, each counter receiving φSC. Once an incoming data stream of has been partitioned into 128 data bits and stored within eight data latches, each data latch having four (4), 4-bit shift registers, the 128 data bits are transferred in parallel to a general shift register in response to the φLOAD signal.

The present invention, thus, dramatically increases data transfer capabilities from a single, high speed serial port to a general data register. As a result, the operating speed of a dual port memory device within an image display device incorporating the present invention can be increased without allocating multiple pin outs to serial data port operations.

While the present invention has been particularly shown and described with reference to a preferred embodiment, it is understood by those of ordinary skill in the art that modifications, and design variations may be made to the foregoing exemplary embodiment without departing from the scope of the present invention as defined by the following claims. For, example, the number of data latches and/or shift registers within data latches might be routinely varied according to specific design requirements.

What is claimed is:

1. A serial data port in a dual port memory device adapted to receive incoming serial data and transfer said incoming serial data to a general data register, comprising:

a plurality of data latches storing a portion of said incoming serial data, each one of said plurality of data latches comprising a plurality of shift registers, each one of said plurality of shift registers being responsive to one of a plurality of sequentially generated shift register control signals;

a plurality of transfer gates, each one of said plurality of transfer gates gating said incoming serial data into a corresponding one of said plurality of data latches in responsive to one of a plurality of sequentially generated data latch control signals;

wherein each one of said plurality of data latch control signals defines a time period, and said plurality of shift register control signals is sequentially generated within said time period.

2. The serial data port in a dual port memory device of claim 1, wherein each one of said plurality of transfer gates is a NMOS device.

3. The serial data port in a dual port memory device of claim 1, wherein each one of said plurality of data latches transfers its stored portion of said incoming serial data to said general data register in response to a data loading control signal.

4. The serial data port in a dual port memory device of claim 1, further comprising:

a data input buffer receiving said incoming serial data and converting said incoming serial data into CMOS compatible signal levels.

5. The serial data port in a dual port memory device of claim 1, responsive to a master clock control signal, wherein each one of said plurality of data latch control signals has a period equal to sixteen times a period for said master clock signal, and wherein each one of said plurality of shift register control signals has a period equal to four times the period for said master clock signal.

* * * * *